US009921262B2

(12) United States Patent
Schindler et al.

(10) Patent No.: US 9,921,262 B2
(45) Date of Patent: Mar. 20, 2018

(54) METHOD AND APPARATUS FOR A PROBE CARD

(71) Applicant: Elma Electronic Inc., Fremont, CA (US)

(72) Inventors: Walter A Schindler, Pleasanton, CA (US); Jerry Choy, Fremont, CA (US)

(73) Assignee: Elma Electronic Inc., Fremont, CA (US)

(*) Notice: Subject to any disclaimer, the term of this patent is extended or adjusted under 35 U.S.C. 154(b) by 165 days.

(21) Appl. No.: 14/681,041

(22) Filed: Apr. 7, 2015

(65) Prior Publication Data
US 2016/0299173 A1 Oct. 13, 2016

Related U.S. Application Data

(60) Provisional application No. 61/995,316, filed on Apr. 8, 2014.

(51) Int. Cl.
*G01R 31/20* (2006.01)
*G01R 31/28* (2006.01)

(52) U.S. Cl.
CPC .............. *G01R 31/2808* (2013.01)

(58) Field of Classification Search
CPC .................... G01R 1/07342; G01R 1/07364
USPC .............................. 324/750.25, 758
See application file for complete search history.

(56) References Cited

U.S. PATENT DOCUMENTS

| 2005/0162179 | A1* | 7/2005 | Hosaka | G01R 1/06738 324/755.01 |
| 2009/0206860 | A1* | 8/2009 | McFarland | G01R 1/44 324/750.03 |
| 2015/0109015 | A1* | 4/2015 | Johnson | G01R 31/2889 324/756.03 |

* cited by examiner

*Primary Examiner* — Farhana Hoque
(74) *Attorney, Agent, or Firm* — Sanjay Bhardwaj; Law Offices of Sanjay Bhardwaj

(57) ABSTRACT

An integrated apparatus and method to provide test, diagnostics and characterization access to backplane electrical signals during electronic product development is presented. The apparatus removes need for manual and ad hoc connections made in an engineering laboratory or assembly line which make the process prone to damage of the components, inaccurate measurements and arbitrary fluctuations in function. The method and apparatus is a mechanized way to connect backplane signals to corresponding drivers, receivers and test equipment through probes placed on equidistant electrical traces, reducing inter signal variations.

18 Claims, 16 Drawing Sheets

METHOD AND APPARATUS FOR A PROBE CARD

This non-provisional patent application claims benefit of priority date through specific reference to provisional patent application No. 61/995,316 dated Apr. 8, 2014 under 35 U.S.C. § 119 (e)(1). See also 37 C.F.R. 1.78.

FIELD OF THE INVENTION

The present invention relates generally to probe cards used in electronics More specifically, the present invention is an electronic and mechanical system which is used in the diagnostics and characterization of printed circuit boards with back planes for board to board interfaces.

BACKGROUND OF THE INVENTION

Electronic systems comprise, among other things, a plurality of printed circuit boards with electronic components. Such components may be application specific integrated circuits (ASICs), field programmable gate arrays (FPGAs), dynamic random access memories (DRAMs), flash memories, central processing units (CPUs), read only memories (ROMs), capacitors, inductors, resistors and wires. With the improvement of semiconductor technology, most of chip to chip and board to board electronic interfacing occurs through the use of a serializer and deserializer (serdes) protocol, over which transaction level communication occurs. When the semiconductor technology was not fully matured, the speeds achievable at these serdes interfaces were limited. Accordingly, pin count optimization was not possible through use of serdes technology as the low speeds limited the bandwidth of communication. Such limitation in bandwidth was compensated through widening of the chip-to-chip and board-to-board interfaces from being a single data bit interface to a byte (8 bits), half word (16 bits), word (32 bits) or double word (64 bits).

Serial interconnects have matured to the point where speed, reliability, and robustness make them a viable option for board-to-board connections. By eliminating need for parallel busses and defining new protocols leveraging serial technologies such as PCI Express, Ethernet, Serial RapidIO, pins can be freed up to support proper number of data and control plane pins without losing board-to-board bandwidth.

The original version of VME created in the 1980 and standardized as IEEE 1014-1987, called for 3U and 6U form factors for the backplanes. The 3U format comprises of a single 96-pin P1 connector to support the popular 16-bit microprocessors and the board size was similar to contemporary standards.

However, over time the 3U VME format lost its place as address and data bus widths increased, calling for more pins on the backplane. As 32-bit processors evolved, the 6U format with both P1 and P2 connectors became the de facto size of choice for VME.

The 3U and 6U form factors are also chosen for VPX, the ANSI/VITA 46 family of specifications. VPX has defined both a 3U and 6U format, allowing designers to choose the best for their application. VPX is an ANSI standard (ANSI/VITA 46.0-2007) that provides VME bus-based systems with support for switched fabrics over a new high speed connector. A 3U front panel is 132 mm long, while a 6U front panel is 265 mm long, and both are 100 mm in width.

New generations of embedded computing systems based on the VPX standard reflect the growing significance of high speed serial switched fabric interconnects such as RapidIO, 10 Gigabit Ethernet, PCI Express, and Infiniband. These technologies are replacing traditional parallel communications bus architectures for local communications, because they offer significantly greater capability. Switched fabrics technology supports multiprocessing systems that require the faster possible communications between processors (e.g., digital signal processing applications). VPX gives the large existing base of VMEbus users access to these switched fabrics. Technologies called for in VPX include 3U and 6U formats and new 7-row high speed connector rated up to 6.25 Gbit/s. In networking applications, these speeds are now approaching 25 Gbit/s.

As a drawback, increase of width of the interfaces has a consequent cost component as the increase in pin count mandated a costlier chip package, larger PCBs, higher power dissipation. With advent of higher integration and improvements in semiconductor technology, the clock speed of a serdes interface, which was limiting, increased exponentially. Where a serdes interface of 550 MHz at one point was a challenge, current serdes technology is now feasible to support upto 25 Gbit/s. With this exponential improvement in speed, the widening of the bus width to meet bandwidth requirements is no longer needed. Semiconductor chips and PCB designers exploited this improvement in technology to design inter-chip and inter-board protocols with serdes interfaces. While enabling more integration and reduction of sizes of the PCBs and semiconductor chips, the high speed interfaces between chips and between boards over backplanes have to be robustly designed for the protocols over them to work correctly.

The serdes interfaces between boards and chips over the backplanes, operating at very high speeds have to be tested for feasibility and reliability of correct bit transfer at desired rates. Tests have to be run and interfaces characterized and measured for best and worst case transition delay, temperature and process variations. Such measurements require a minimum of two and up to supportable slots of PCBs to be populated over a backplane. Then signals over and between any two slots are to be measured and characterized for these parameters. In the current state of technology, such measurements require human intervention, design of daughter cards, soldering and connecting probes and wires on boards under test. At very high speeds, such efforts affect both geometry and physical behavior of the electrical circuit that is subject of test and characterization. Accurate measurements are difficult due to fringe effects, hard to maintain uniformity and variations due to human touch. Due to abrupt and numerous connections and disconnections, a likelihood of damage to the semiconductor component or the PCB is not ruled out. Sometimes this leads to discard of entire PCB due to failure of a single semiconductor component. Losses this way affect the margins and increase the recurring costs in product design.

The present invention overcomes these challenges in backplane design, test and characterization. A probe card is designed, which is connectable in slot increments in one dimension and in pin pitch increment in other dimension on the backplane interconnects of the PCB. Two probe cards, located in different slots of the backplane are required to check the electrical performance of traces routed on the backplane. The probe cards have to be moved and positioned in increments relating to the slot to slot pitch and to the backplane connector's own row to row pitch.

The probe card provides mechanics to be able to engage and disengage the connections, avoiding need of human intervention on the PCBs. The probe card, designed as a semi-circle in one embodiment, provides the probe connects distributed along its circumference for easy connections to probes, drivers and receivers of the serial or parallel connections. In the present invention, test, diagnosis, probing and characterization are enabled while overcoming the shortcomings of the present art. Reliability, cost, time to design and market are all positively impacted.

Conventional probe cards are generally inserted into the backplane without any mechanical features guiding the process. Probe cards equipped with connectors with high insertion forces, like Multi-Gig connectors, are difficult to position and connect/disconnect from the backplane without damaging the connectors or without affecting the accuracy of the backplane performance measurements. The present invention overcomes these shortcomings.

Due to this invention, both testing and qualification of electrical interface is facilitated by providing symmetric, robust and functionally isolated probing points for backplane signals. The method and apparatus is flexible and adaptive to all laboratory test assemblies and equipment. Measurements are accurate and effect of human interventions in making and changing connections in the laboratory are minimized and isolated from probing results. Damages to sensitive electronic parts and components are minimized.

DETAIL DESCRIPTIONS OF THE INVENTION

All illustrations of the drawings are for the purpose of describing selected versions of the present invention and are not intended to limit the scope of the present invention.

In the following description specific details are set forth describing certain embodiments. It will be apparent, however, to one skilled in the art that the disclosed embodiments may be practiced without some or these entire specific details. The specific embodiments presented are meant to be illustrative, but not limiting. One skilled in the art may realize other material that, although not specifically described herein, is within the scope and spirit of this disclosure.

In one embodiment of the apparatus, the probe card is attached to a mechanical structure. In one embodiment, this comprises of movable parts which perform the required functions. In an exemplary embodiment, the whole probe card device has to fit within the envelope of one slot. In one test configuration, two probe cards are required to perform the testing. As an exemplary embodiment, the second probe card is attached to a basically mirrored mechanical structure.

In one functional use, as a first step, the probe card positioning device is placed on the slot to be tested by means of engaging the alignment pins on the backplane. In another embodiment, this is done using the backplane mounting holes. Alternatively, this could be achieved by alternate positioning means. In one embodiment, a clamping feature secures the probe card positioning device to the backplane.

As an adaptive feature of the present invention, in one embodiment, one mounting block of the probe card device can be moved to different locations along the bridge beam. In one functional use, it enables support for various backplane configurations. In one embodiment of the device, support is provided for both 6U (comprising of P1 and P2 connectors) and 3U (comprising of P1 connectors only) configurations.

In one embodiment, after positioning the probe card device on the backplane, the probe card connector is inserted into the backplane connector. Probe card connector can be positioned along the bridge beam in predetermined increments. In one exemplary embodiment, one means of positioning the probe card is by a set of holes drilled into the bridge beam. In this embodiment, a pin set in a corresponding hole acts as a stop. In one exemplary embodiment, the probe card is moved to the stop and locked in this position. This is achieved by tightening a thumb screw safety lock. The connector of the probe card is then inserted in the connector of the backplane by lowering the probe card, rotating a handle. Rotating the handle in the opposite direction disengages the probe card from the backplane. A stop keeps the load card in the disengaged position, ready to be repositioned.

Figure 1:
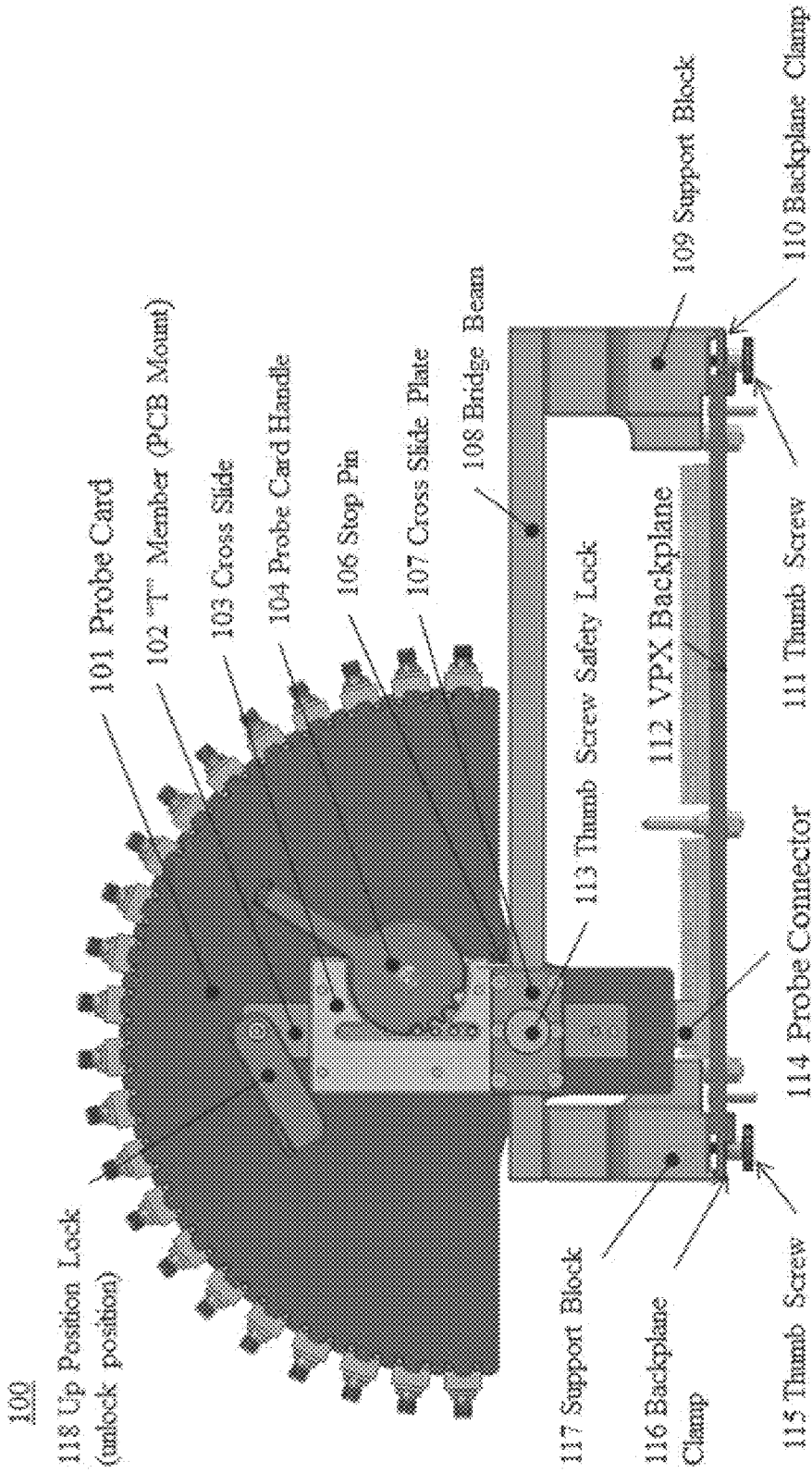
FIG. 1 is one embodiment of the probe card apparatus showing the semi-circle probe card, probing interfaces, engaging probe card handle with a bridge beam supporting 6U backplane connection.

FIG. 1 100 presents a one dimension front view of the probe card apparatus mounted on a 6U backplane 112. In one embodiment, a probe card 101 is designed in a semi-circle shape with a plurality of probe connect points mounted on the circumference for connection to test assembly, driver or receiver of electrical signals. In one embodiment, a "T" Member PCB mount 102 is placed with a cross slide 103. In an exemplary embodiment, the PCB mount 102 has protruding slots that fit into circumferential holes of a probe card handle 104. In other embodiment, the probe card may have other geometries. In one embodiment, using a bridge beam 108, cross slide plate 103, cross slide 106, two support blocks 109 117, two backplane clamps 110 116 and two thumb screws 111 115, the probe card is mounted over a backplane 112. In one embodiment, the probe card 101 tapers from the semi-circle portion to a thin attachment at the end of which a probe connector 114 is installed. An up position lock 118 is attached to the PCB mount 102. In the illustration, the up position lock 118 is in unlock position, indicating that the probe card 101 is engaged with the probe connector 114 in the desired slots of the backplane connector 112.

Figure 2:
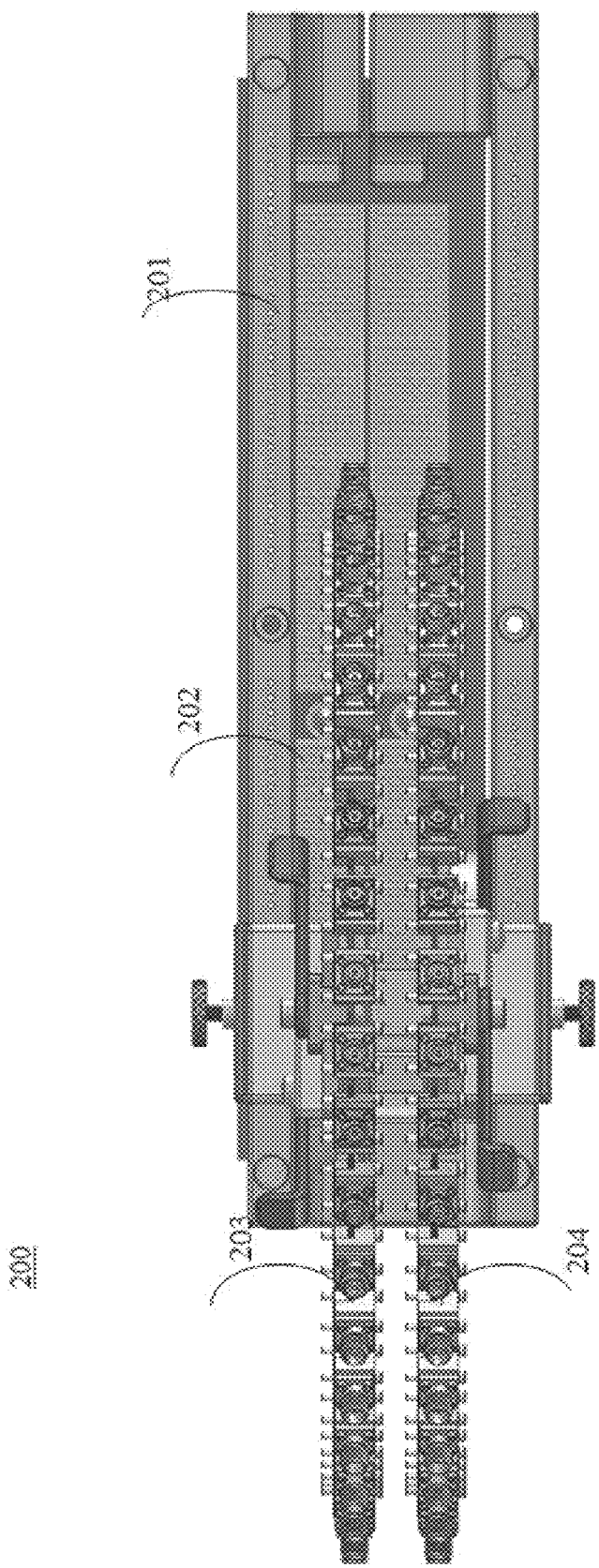
FIG. 2 is one embodiment of a top level view of the apparatus with two probe cards engaged on a 6U backplane.

FIG. 2 200 is an illustrative embodiment of the above embodiment in a top view of the apparatus. The semi-circular probe cards 203 204 appear rectangular with the probe connection points. The bridge beam has a P1 connector section 202 and a P2 connector segment 201. The mounting apparatus is also seen in one dimension from the top.

Figure 3:
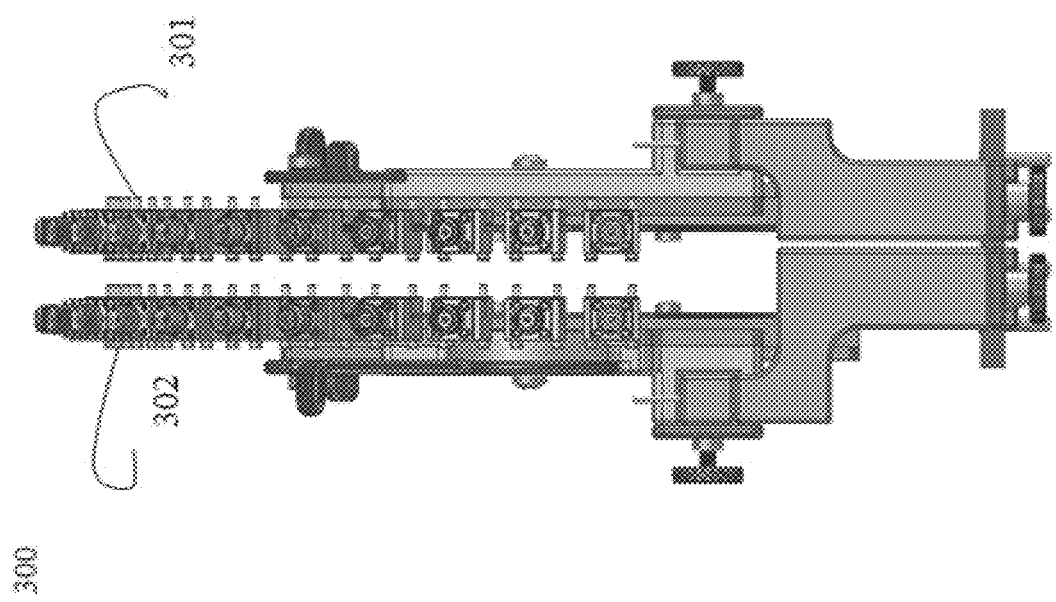
FIG. 3 is an embodiment of a side view of the dual probe card setup on a 6U backplane.

FIG. 3 300 is an illustrative embodiment of the above embodiment in a side view of the apparatus. The semi-circular probe cards 301 302 appear rectangular with the probe connection points. The bridge beam and the rest of the mounting apparatus are also seen in one dimension from the side.

Figure 4:
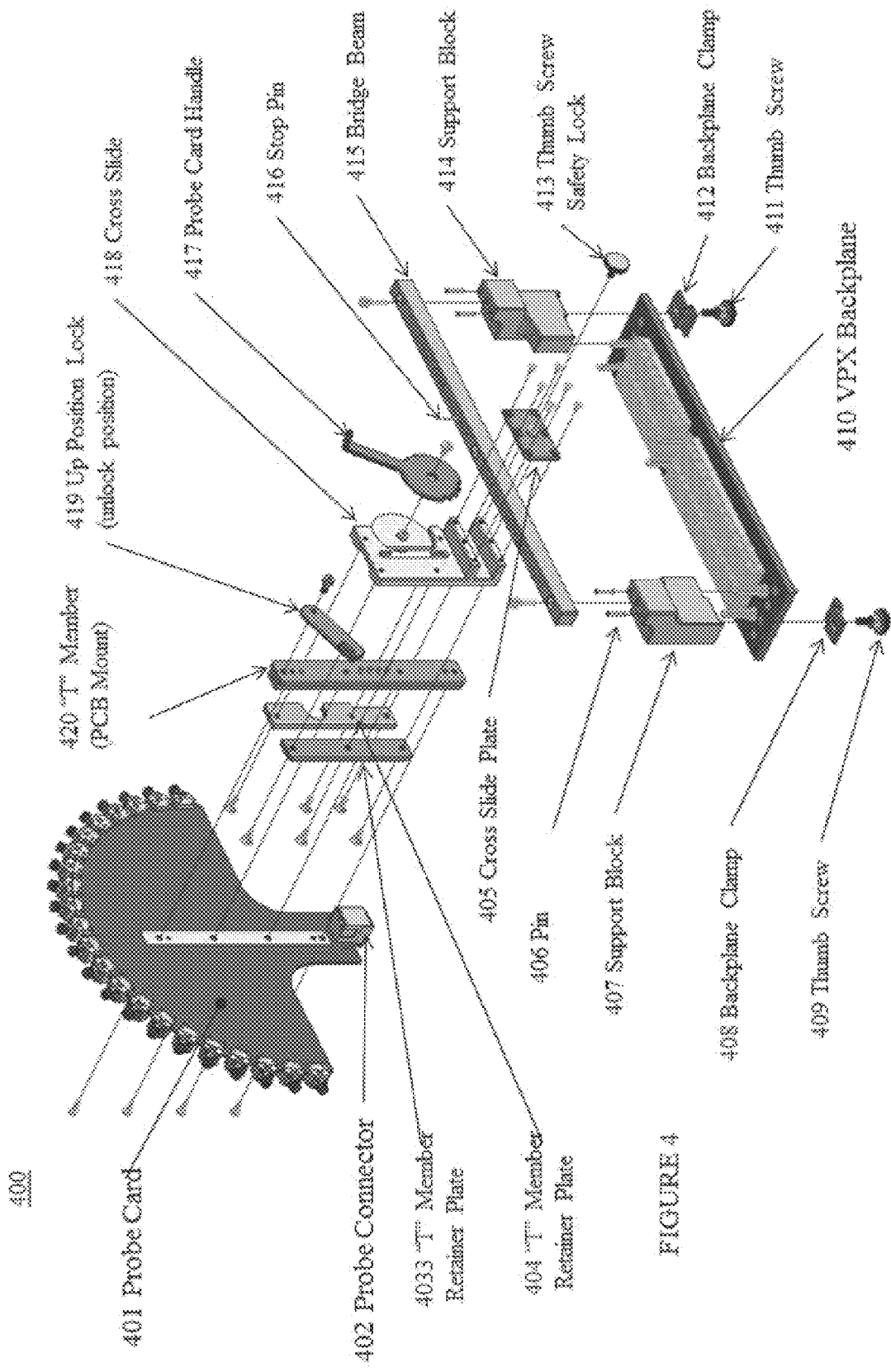
FIG. 4 is one embodiment in an exemplary way of an exploded isometric view of the components of the apparatus. Each component is identified in relation to its connected elements.

FIG. 4 400 is an isometric exploded view of the device apparatus. A VPX backplane 410 in 6U format is shown. The mounting apparatus of thumb screws 409 411, backplane clamps 408 412 and support blocks 407 414 with pins 406 are used to install a bridge beam 415. Using cross slide 418 and cross slide plate 405, T member retainer plates 403 404, the probe card handle 417 and the up position lock, and thumb screw safety lock 413, the probe card 401 with a probe connector 402 is mounted on the bridge beam using screws. The explode view illustrates all of the parts involved as well their location and connecting parts.

Figure 5:
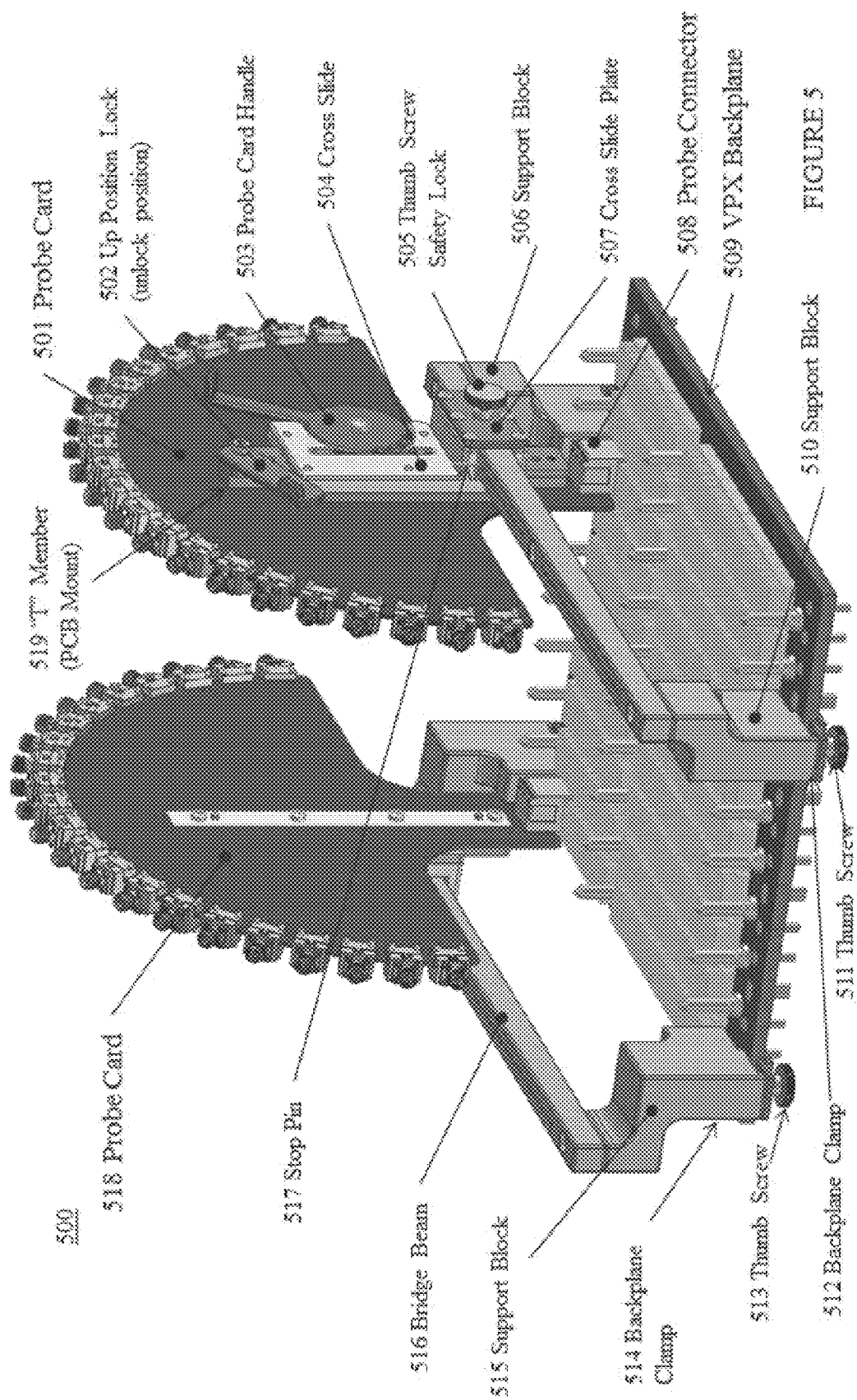
FIG. 5 is an exemplary embodiment of an isometric view of a dual probe card setup on a 6U backplane with the probe card engaged based on the position of the handle.

FIG. 5 500 represents an isometric view, illustrating two simultaneous probe cards 501 518 mounted on the two respective bridge beams 516. Both probe cards 501 518 are in an engaged position, with the up position lock 502 in unlock position. The front side of the probe card is shown in the front 501, while the back of the same is shown for the other port card 518. Both cards are mounted on the bridge beams 516 using thumb screws, 513 511 support blocks 515 510, backplane clamps 514 512 and thumb screw safety locks 505. The VPX backplane 509 is in a 6U format. The probe cards 501 518 have their respective mechanical components of a probe card handle 503, PCB mount 519, stop pin 517, cross slide 504 and cross slide retainers. The isometric view illustrates the apparatus engaged in a 6U backplane format.

Figure 6:
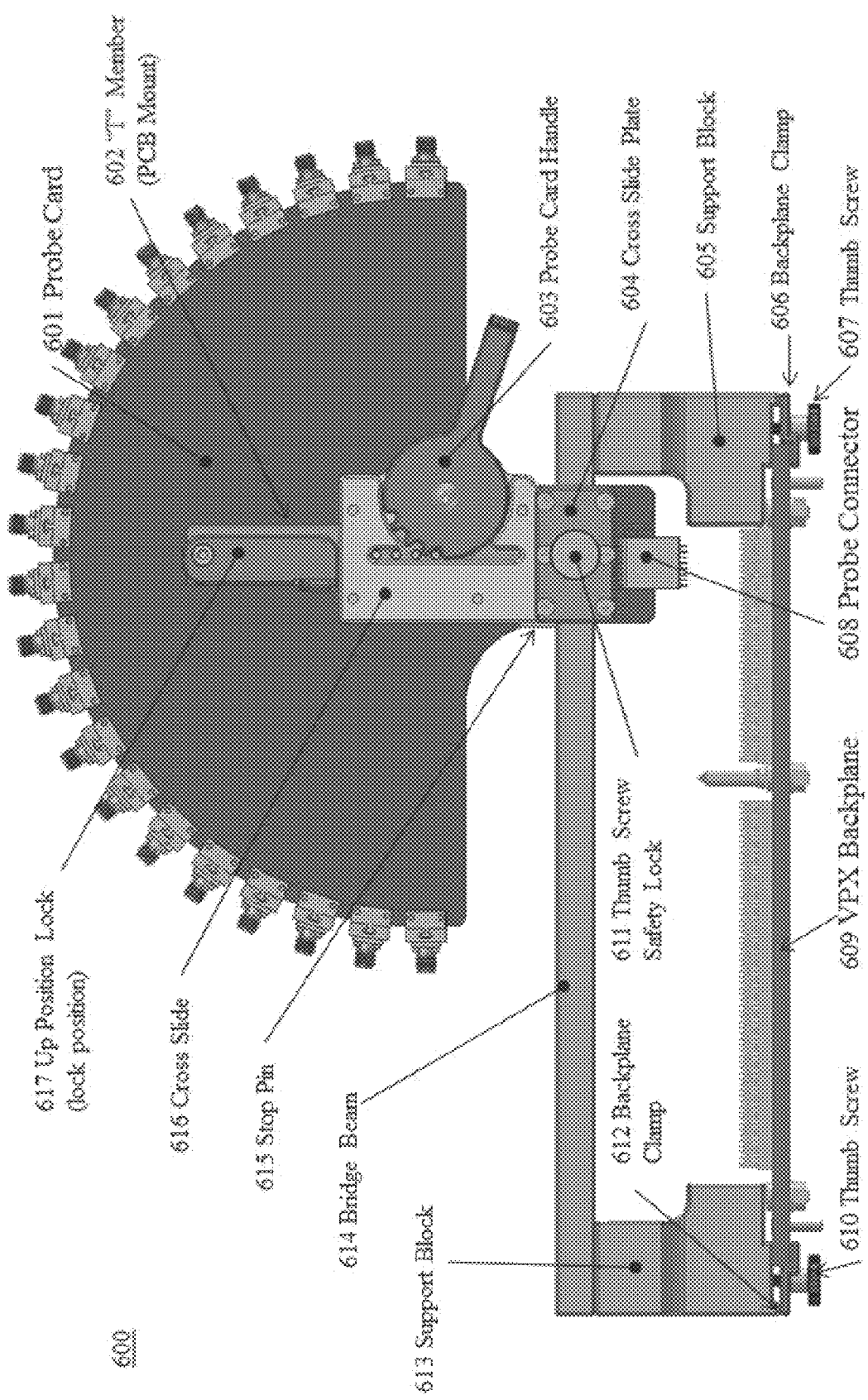
FIG. 6 is an exemplary embodiment of a front view of the apparatus where the probe card is disengaged, based on the position of the probe card handle.

FIG. 6 600 illustrates in one embodiment, the 6U format backplane 609 with probe card disengaged 601. This figure is in a front view. The bridge beam 614 is mounted over the selected slot of the backplane 609 using thumb screws 607 610, backplane clamps 606 612, thumb screw safety lock 611 and support blocks 605 613 The probe card handle 603 is in a downward position, essentially lifting the probe card 601 through T member PCB mount 602 and all connecting apparatus. This includes cross slide plate 604, cross slide retainers, stop pin 615 and up position lock 617. The probe connector 608 is seen lifted from the backplane slot 609, with probe card handle 603 in a "down" position. The up position lock 617 is in lock position to avoid accidental dropping of the connector 608 onto the backplane 609. For a proper connection, the lock 617 will have to be taken to unlock position, after which the probe card handle 603 will move anticlockwise to lower the probe connector 608.

Figure 7:
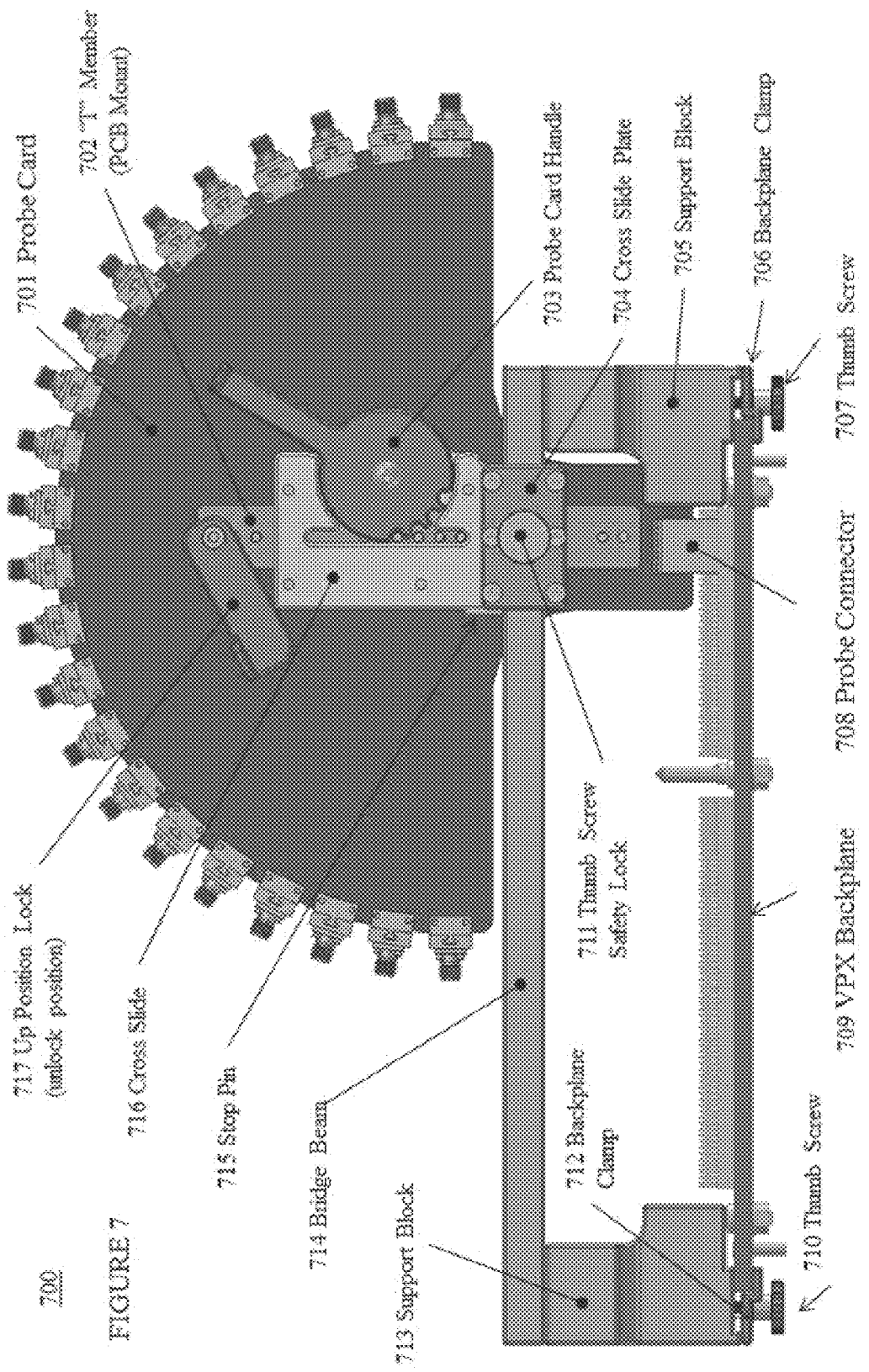
FIG. 7 is an exemplary embodiment of a front view of the probe card apparatus where the probe card is engaged to a 6U backplane with up position lock in an "unlock" position.

FIG. 7 700 illustrates in one embodiment, a similar view as above with the probe card 701 engaged. The mounted apparatus has moved to the P1 connector side on the backplane 709. The thumb screws 710 707, backplane clamps 712 706, attach the VPX backplane 709 to the bridge beam 714. The probe card apparatus comprising of probe card 701, cross slide 716, stop pin 716, up position lock 717 and PCB mount 702 are then attached to the bridge beam 714 with mechanism of cross slide plate 704 and probe card handle 703 to engage and disengage the probe card 701 on to the backplane 709. In this illustrative embodiment, the probe connector 709 is engaged on the back plane 709. Consequently, the up position lock 717 is in "unlock" position.

Figure 8:
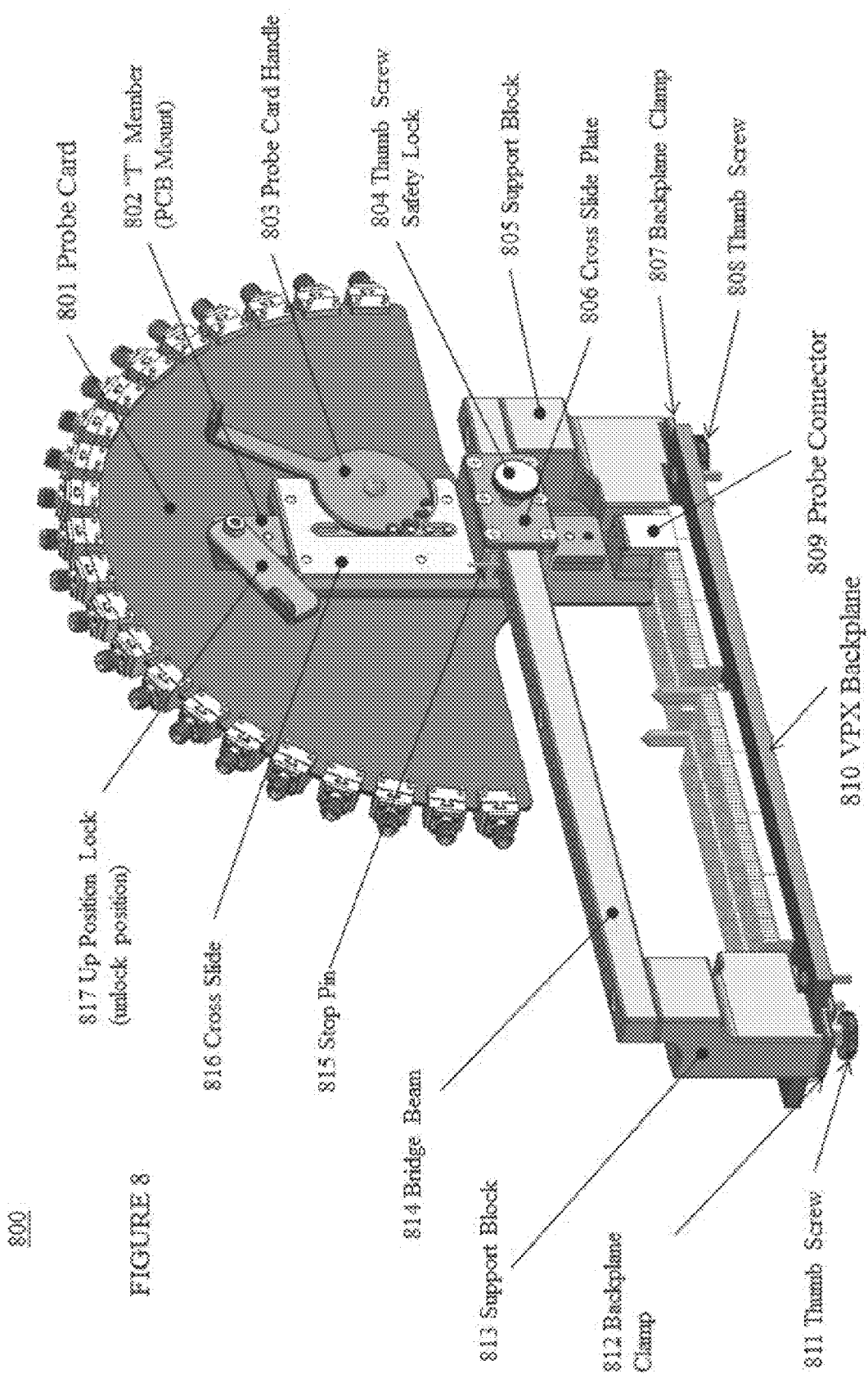
FIG. 8 is an exemplary embodiment of an isometric view of the probe card apparatus with the probe card engaged to the 6U backplane and the up position lock in an "unlock" position.

FIG. 8 800 illustrates in one embodiment, an isometric view as above with the probe card 801 engaged. The mounted apparatus has moved to the P1 connector side on the backplane 810. The thumb screws 808 811, backplane clamps 812 807, attach the VPX backplane 810 to the bridge beam 814. The probe card apparatus comprising of probe card 801, cross slide 716, stop pin 816, up position lock 817 and PCB mount 802 are then attached to the bridge beam 814 with mechanism of cross slide plate 806 and probe card handle 803 to engage and disengage the probe card 801 on to the backplane 810. In this illustrative embodiment, the probe connector 809 is engaged on the back plane 810. Consequently, the up position lock 817 is in "unlock" position.

Figure 9:
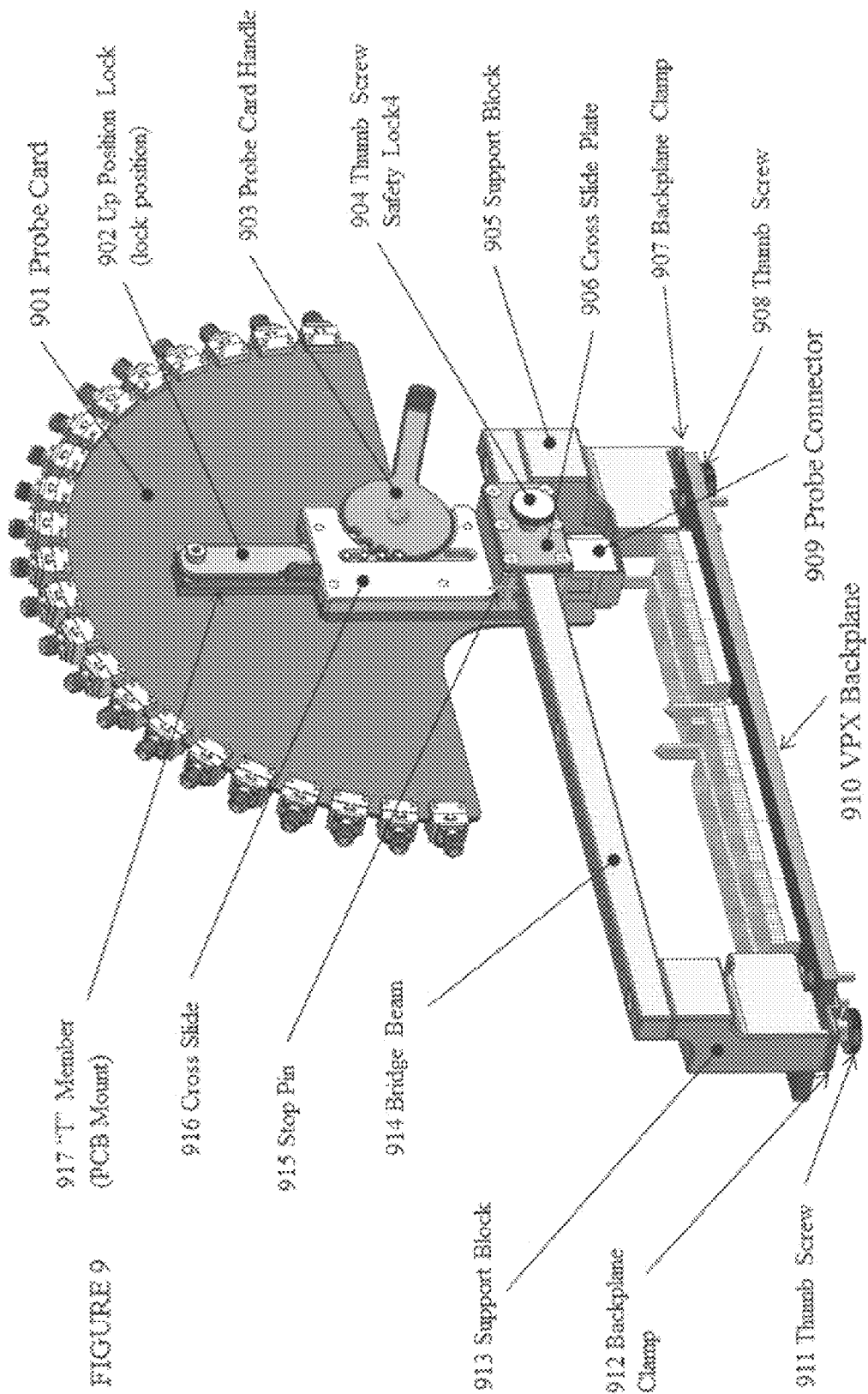
FIG. 9 is an exemplary embodiment of an isometric view of the probe card apparatus with the probe card disengaged to the 6U backplane and the up position lock in a "locked" position to prevent accidental engagement.

FIG. 9 900 illustrates in one embodiment, an isometric view as above with the probe card 901 disengaged. The mounted apparatus has moved to the P1 connector side on the backplane 910. The thumb screws 908 911, backplane clamps 912 907, attach the VPX backplane 910 to the bridge beam 914. The probe card apparatus comprising of probe card 901, cross slide 916, stop pin 815, up position lock 917 and PCB mount 902 are then attached to the bridge beam 914 with mechanism of cross slide plate 906 and probe card handle 903 to engage and disengage the probe card 901 on to the backplane 910. In this illustrative embodiment, the probe connector 909 is disengaged on the back plane 910. Consequently, the up position lock 917 is in "lock" position.

Figure 10:
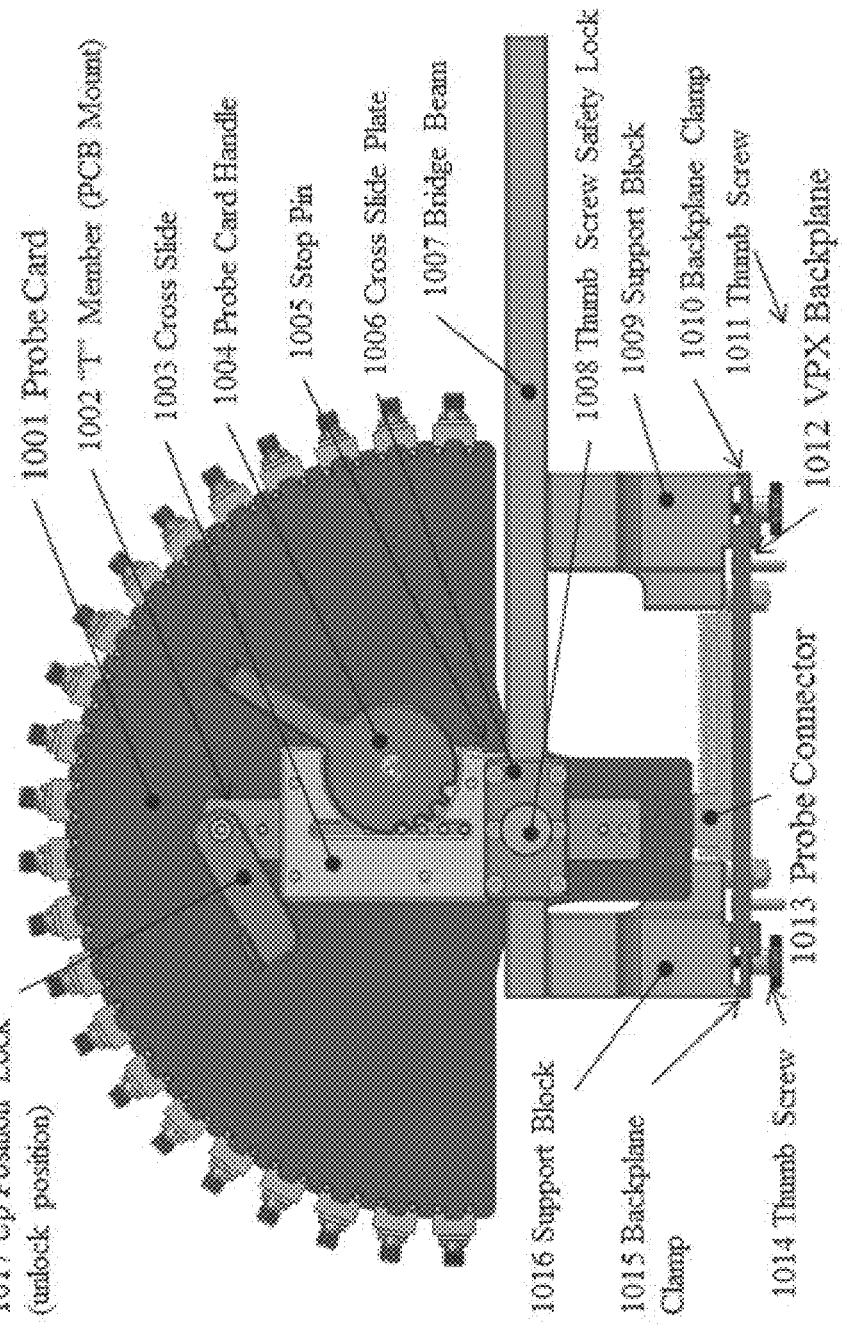
FIG. 10 is one embodiment of the probe card apparatus showing the semi-circle probe card, probing interfaces, engaging probe card handle with a bridge beam supporting 3U backplane connection. It has a single P1 connector.

FIG. 10 1000 illustrates in one embodiment, a single dimension view as above with the probe card 1001 engaged for a 3U backplane with only a row of P1 connectors. The mounted apparatus has only the P1 connector row on the backplane 1012. The thumb screws 1011 1014, backplane clamps 1010 1015, attach the VPX backplane 1012 to the bridge beam 1007. The probe card apparatus comprising of probe card 1001, cross slide 1003, stop pin 1005, up position lock 1017 and PCB mount 1002 are then attached to the bridge beam 1007 with mechanism of cross slide plate 1006 and probe card handle 1004 to engage and disengage the probe card 1001 on to the backplane 1012. In this illustrative embodiment, the probe connector 1013 is engaged on the back plane 1012. Consequently, the up position lock 1017 is in "unlock" position.

Figure 11:
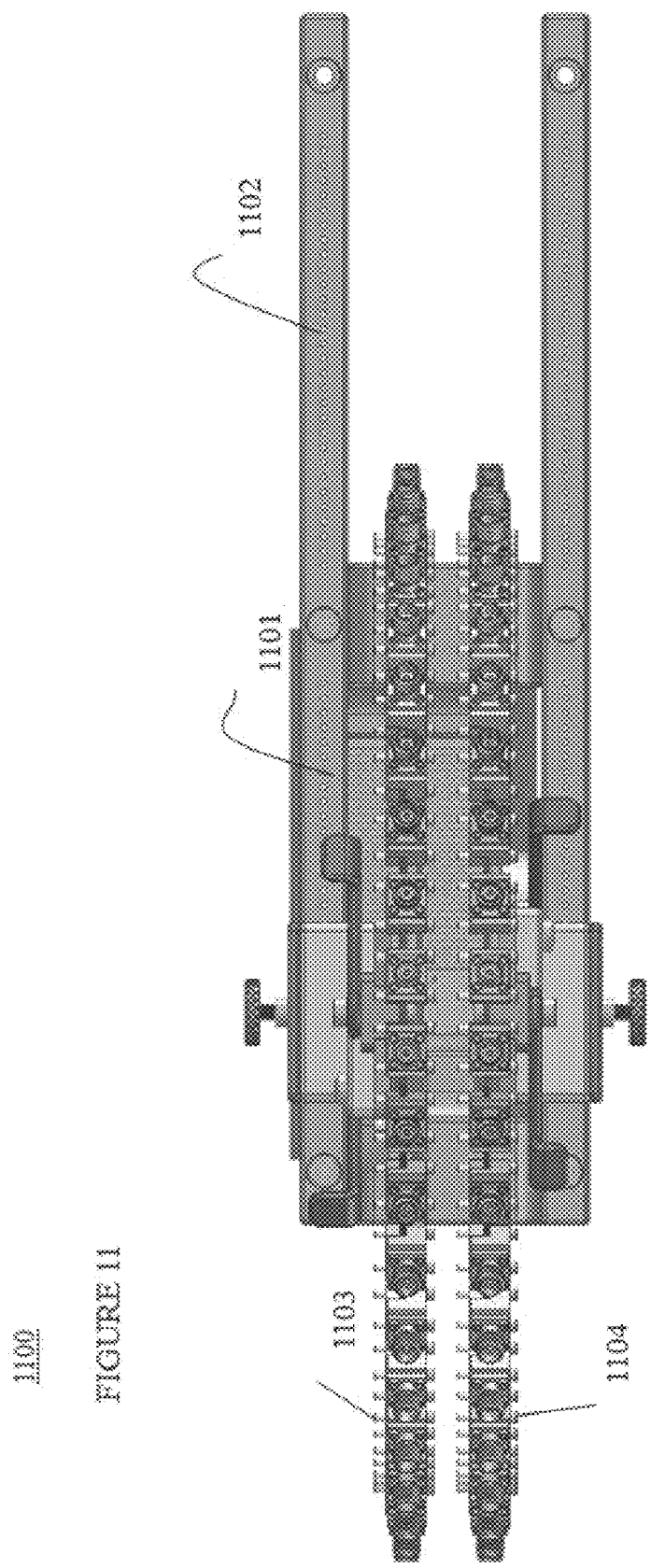
FIG. 11 is one embodiment of a top level view of the apparatus with two probe cards engaged on a 3U backplane.

FIG. 11 1000 illustrates in one embodiment, a top view as above with the probe card 1103 1104 engaged for a 3U backplane with only a row of P1 connectors. The mounted apparatus has only the P1 connector row on the backplane 1011 1102.

Figure 12:
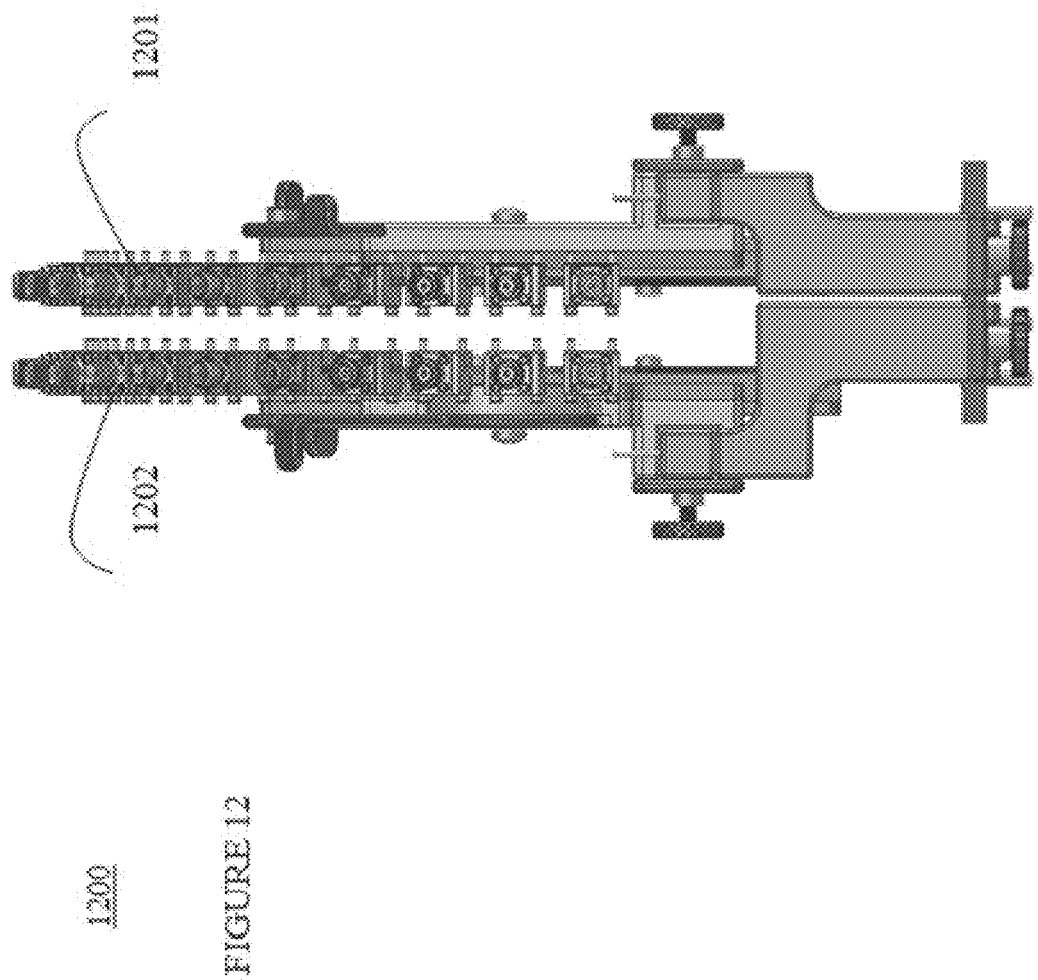
FIG. 12 is an embodiment of a side view of the dual probe card setup on a 3U backplane.

FIG. 12 1200 illustrates in one embodiment, a side view as above with the probe card 1101 1102 engaged for a 3U backplane with only a row of P1 connectors. The mounted apparatus has only the P1 connector row on the backplane.

Figure 13:
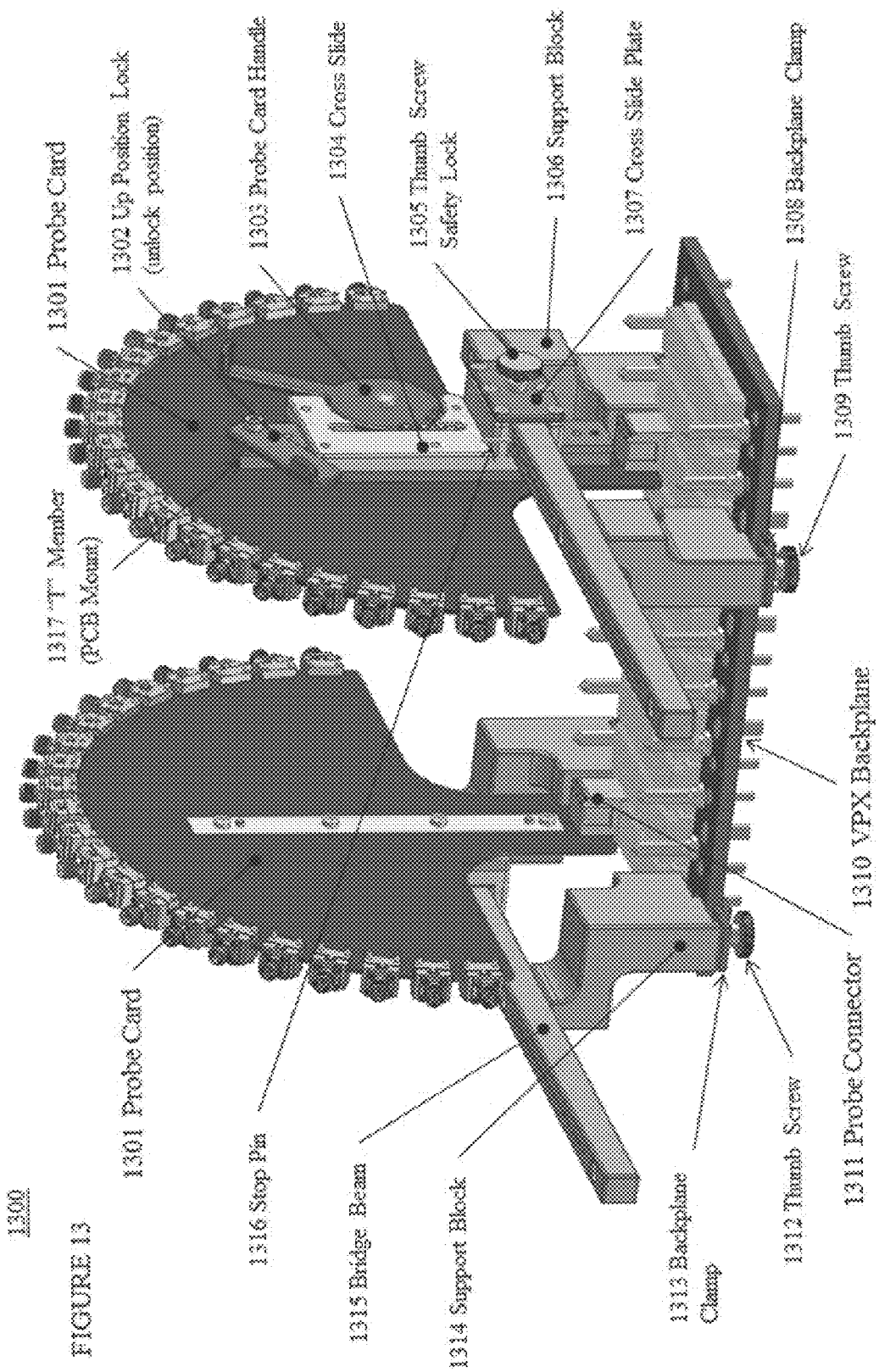
FIG. 13 is an exemplary embodiment of an isometric view of the probe card apparatus with the probe card disengaged to the 3U backplane and the up position lock in an "unlock" position.

FIG. 13 1300, in one exemplary embodiment illustrates a multi-dimension isometric view of the apparatus of two probe cards engaged over a 3U backplane comprising of only P1 connectors. VPX backplane has two bridge beams 1315 mounted over it through thumb screw 1312 1309, backplane clamps 1313 1308, and support blocks 1314 1306. Probe connector 1311 is engaged. On the corresponding bridge beams 1315, the two probe cards 1301 are mounted through PCB mount 1317, cross slide 1304, stop pin 1316, thumb screw safety lock 1305, up position lock 1302 and probe card handle 1303.

Figure 14:
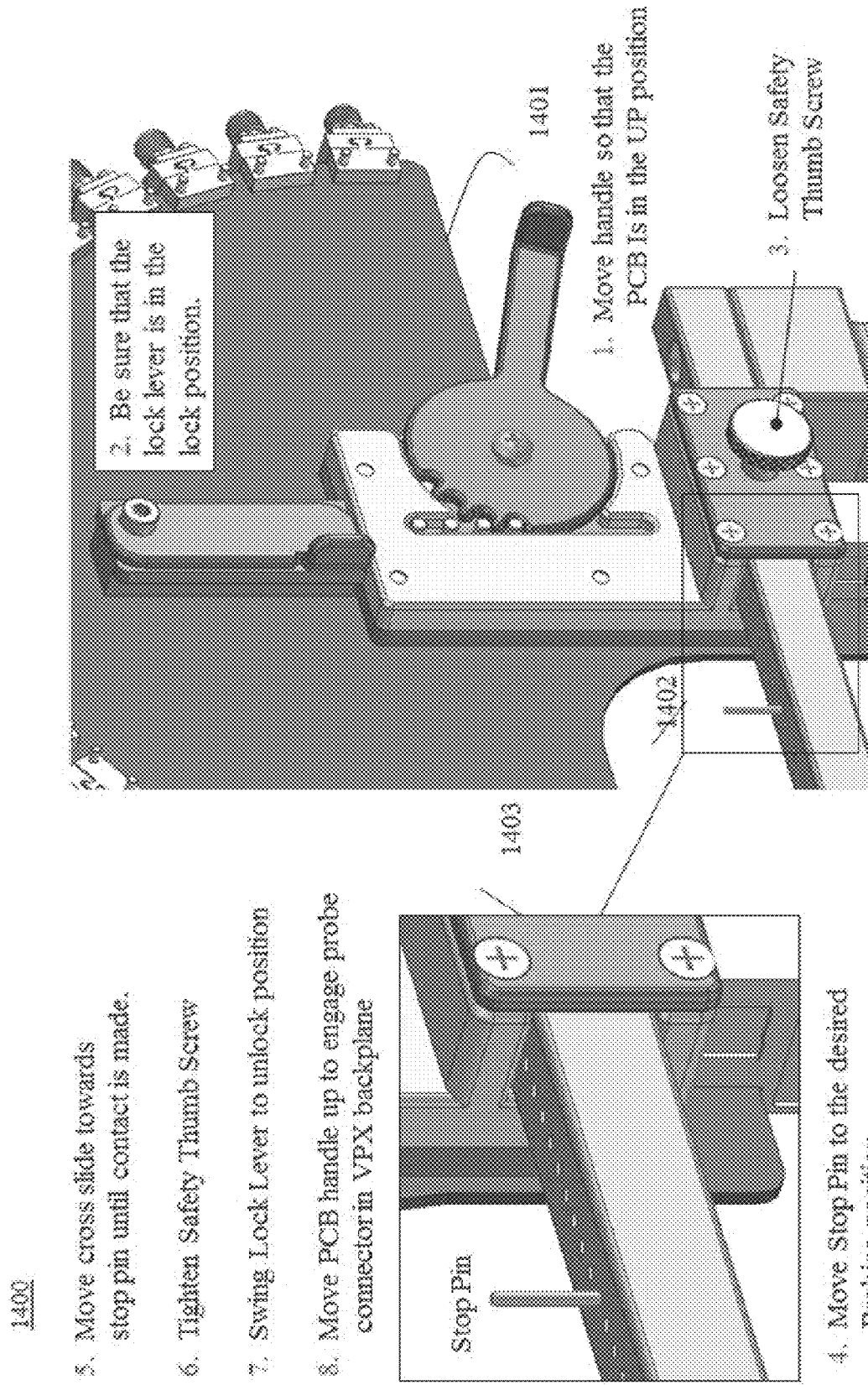
FIG. 14 is an illustrative zoomed view of the probe card engagement and disengagement mechanism using the probe card handle. It also outlines the steps in sequencing order. A zoomed view of the bridge beam and stop pin is also provided.

FIG. 14 1400, in a zoomed isometric view illustrates the steps involved in operating the mechanics for engaging and disengaging the probe card 1401 connector over the backplane. Section marked as 1402 is further zoomed as box 1403 to illustrate the positioning and use of the stop pin. As a first step, the probe handle is moved so that the PCB is in up position 1. It is ensured that the lock lever is in the lock position 2. In one embodiment, the safety thumb screw is loosened 3. The stop pin is moved to properly indicate which pin positions (movement is per pin pitch) the probe connector will engage on the backplane 4. The cross slide is moved towards the stop pin until contact is made 5. In one application, the safety thumb screw is tightened 6. The lock lever is then swung to unlock position 7. The probe handle is then moved to engage probe connector to the VPX backplane 8.

Figure 15:
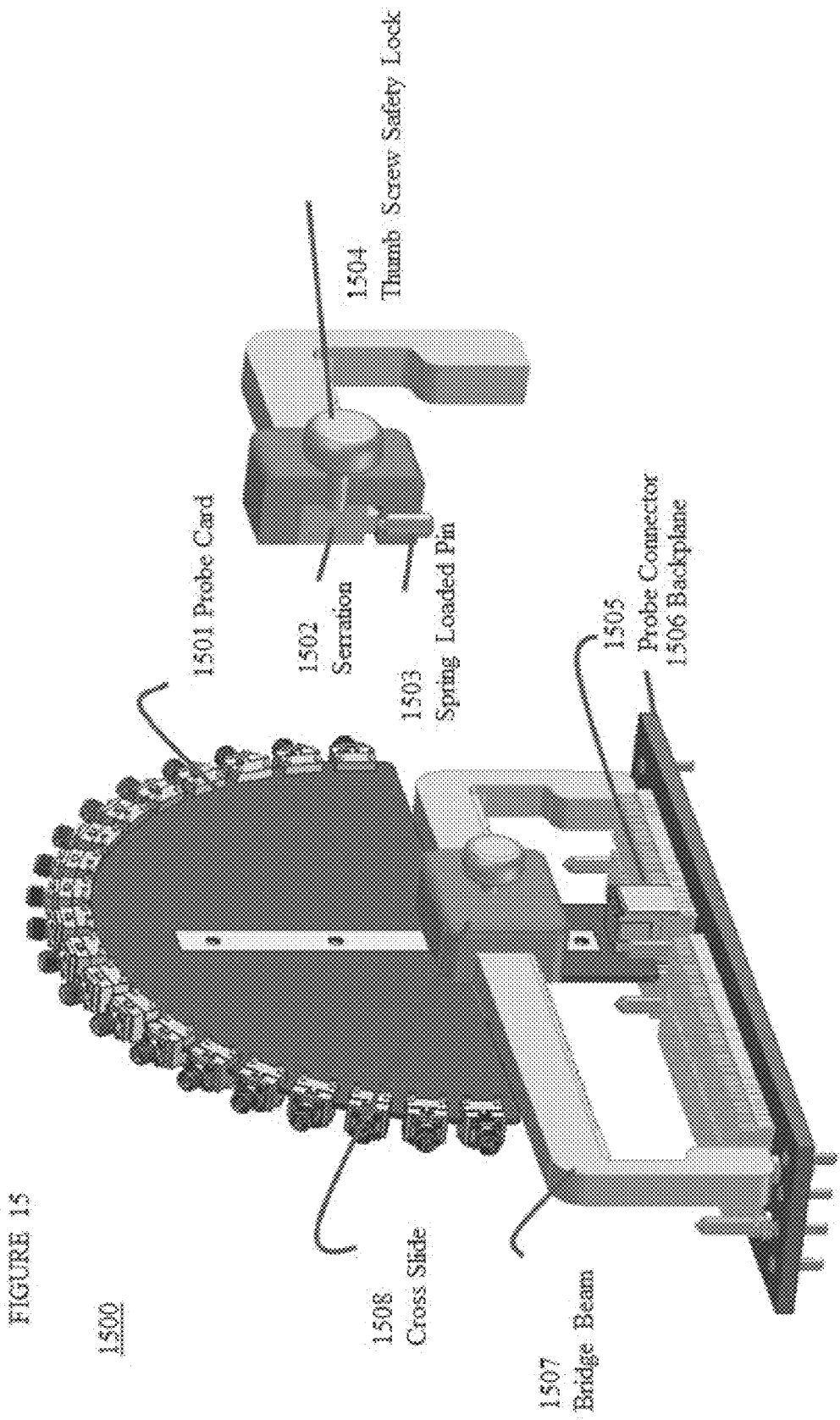
FIG. 15 illustrates another embodiment of the present invention where the engagement and disengagement is done manually with simpler apparatus.

It is obvious to those skilled in the art that probe card devices can be designed in various stages of complexity, meaning more or less features can be incorporated. FIG. 15 depicts a simpler version of a probe card device 1501 where the bridge beam 1507 has a serration 1502 on the lower side and the cross bar contains a spring loaded pin 1503 which allows the cross bar to be moved in predetermined increments over the bridge beam 1507. The probe card connector 1505 is engaged with a backplane 1506 by manually pushing down the probe card device and disengaged by manually lifting the probe card device of the backplane 1506. A thumb screw safety lock 1504 can be loosened or tightened.

Figure 16:
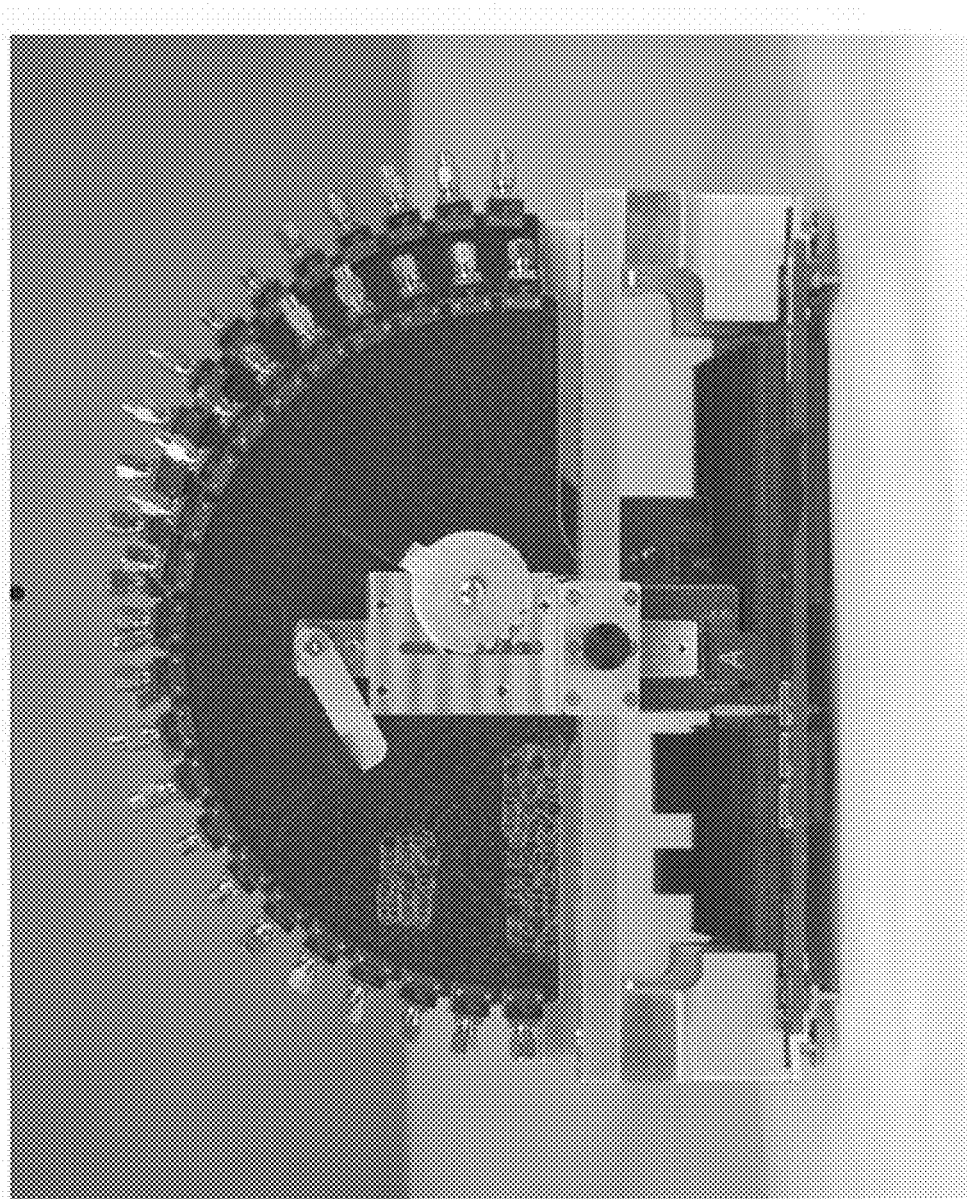
FIG. 16 is a picture of an actual prototype built to the proposed invention's concept and successfully being used in the laboratory setup.

FIG. 16 1600 illustrates, in one embodiment, prototype of the present invention, with two actual probe cards engaged over a 6U backplane. The lock lever is in "unlock" position and handle is turned for the engagement.

It is also apparent to those skilled in the art, that is, to those who have knowledge and experience in this area of technology that the description above explains just two of many possible design variations. The examples provided above are exemplary only and are not intended to be limiting. One skilled in the art may readily devise other systems consistent with the disclosed embodiments which are intended to be within the scope of this disclosure. As such, the application is limited only by the following claims.

What is claimed is:

1. An electro-mechanical probe card device, comprising:
    a probe card with a plurality of peripheral probing connects electrically connected through a plurality of geometry traces to a probe connector and;
    a plurality of mechanical apparatus to mount a probe card on a bridge beam and;
    a plurality of mechanical apparatus to mount a bridge beam on a PCB with a plurality of backplane connectors and;
    a plurality of mechanical apparatus to move a probe card vertically and horizontally and;
    where mechanical apparatus to move probe card PCB vertically comprises spring loaded pin and serration.

2. The probe card device of claim 1 where at least one end of probe card is shaped as a semi-circle.

3. The probe card device of claim 1 where the geometry traces are equidistant from the probe connector to probing connects.

4. The probe card device of claim 1 where mechanical apparatus to mount a probe card on a bridge beam comprises a PCB mount, cross slide, cross slide plate and a probe card handle.

5. The probe card device of claim 1 where mechanical apparatus to mount a probe card is enabled or disabled in vertical direction through a lock.

6. The probe card device of claim 1 where the movement of a probe card in vertical direction is achieved by a probe card handle.

7. The probe card device of claim 1 where movement of probe card in horizontal direction is over a bridge beam using guidance of a stop pin.

8. The probe card device of claim 1 where a stop pin hole to hole movement on the bridge beam horizontally moves the probe connector on the backplane by distance of a plurality multiple of pin pitch.

9. The probe card device of claim 1 where mechanical apparatus to mount a bridge beam on a PCB comprises of a plurality of screws, backplane clamps and support blocks.

10. A method to probe backplane electrical signals comprising:
    a probe card with a plurality of peripheral probing connects electrically connected through a plurality of geometry traces to a probe connector and;
    a plurality of mechanical apparatus to mount a probe card on a bridge beam and;
    a plurality of mechanical apparatus to mount a bridge beam on a PCB with a plurality of backplane connectors and;
    a movement of a probe card vertically and horizontally and;
    where mechanical apparatus to move probe card PCB vertically comprises spring loaded pin and serration.

11. The probing method of claim 10 where at least one end of probe card is shaped as a semi-circle.

12. The probing method of claim 10 where the geometry traces are equidistant from a plurality of probe connectors to a plurality of probing connects.

13. The probing method of claim 10 where a probe card is mounted on a bridge beam for horizontal movement.

14. The probing method of claim 10 where movement of a probe card is enabled or disabled in vertical direction through a lock.

15. The probing method of claim 10 where the movement of a probe card in vertical direction is achieved by a probe card handle.

16. The probing method of claim 10 where movement of probe card in horizontal direction is over a bridge beam using guidance of a stop pin.

17. The probing method of claim 10 where a stop pin hole to hole movement on the bridge beam horizontally moves the probe connector on the backplane by distance of a plurality multiple of pin pitch.

18. The probing method of claim 10 where a bridge beam is mounted on a PCB for horizontal movement.

* * * * *